(12) United States Patent
Maruyama (10) Patent No.: US 11,806,763 B2
(45) Date of Patent: Nov. 7, 2023

(54) SUBSTRATE CLEANING DEVICE AND SUBSTRATE CLEANING METHOD

(71) Applicant: Kioxia Corporation, Tokyo (JP)

(72) Inventor: Yosuke Maruyama, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/467,129

(22) Filed: Sep. 3, 2021

(65) Prior Publication Data

US 2022/0288649 A1 Sep. 15, 2022

(30) Foreign Application Priority Data

Mar. 11, 2021 (JP) ................. 2021-039054

(51) Int. Cl.
*B08B 3/02* (2006.01)
*B05B 13/04* (2006.01)
*B08B 13/00* (2006.01)
*H01L 21/67* (2006.01)

(52) U.S. Cl.
CPC .......... *B08B 3/024* (2013.01); *B05B 13/0431* (2013.01); *B08B 13/00* (2013.01); *H01L 21/67057* (2013.01)

(58) Field of Classification Search
CPC ....... B05B 13/0278–0292; B05B 13/04–0494; B05B 1/20; B05B 1/205; B05B 11/02–04; B08B 13/00; B08B 3/024; H01L 21/67051; H01L 21/67057; H01L 21/6715; H01L 21/6708; H01L 21/67086; H01L 21/673; H01L 21/67303–6733
See application file for complete search history.

(56) References Cited

U.S. PATENT DOCUMENTS

| | | | |
|---|---|---|---|
| 5,379,784 A | 1/1995 | Nishi et al. | |
| 6,164,297 A * | 12/2000 | Kamikawa | H01L 21/67051 134/61 |
| 6,342,104 B1 * | 1/2002 | Kamikawa | H01L 21/67051 134/28 |
| 6,352,083 B1 * | 3/2002 | Araki | H01L 21/67051 134/94.1 |
| 8,361,240 B2 | 1/2013 | Hashimoto | |
| 2004/0194814 A1 * | 10/2004 | Nishimura | C11D 7/261 257/E21.255 |

(Continued)

FOREIGN PATENT DOCUMENTS

| | | | | |
|---|---|---|---|---|
| CN | 104246988 A | * | 12/2014 | ......... H01L 21/6708 |
| CN | 112296005 A | * | 2/2021 | |

(Continued)

*Primary Examiner* — Spencer E. Bell
*Assistant Examiner* — Omair Chaudhri
(74) *Attorney, Agent, or Firm* — Oblon, McClelland, Maier & Neustadt, L.L.P.

(57) ABSTRACT

According to an embodiment, a substrate cleaning device includes a processing tank, at least one spray tube, and a scanning mechanism. The processing tank can accommodate a plurality of substrates arranged in a thickness direction of the substrates. The spray tube extends in the thickness direction and is configured to emit a cleaning liquid to each substrate accommodated in the processing tank. The scanning mechanism is configured to move the spray tube along an outer periphery of the substrate to perform a scan.

6 Claims, 6 Drawing Sheets

(56) References Cited

U.S. PATENT DOCUMENTS

| | | | | |
|---|---|---|---|---|
| 2005/0097771 A1* | 5/2005 | Yi | H01L 21/67028 | 34/444 |
| 2007/0017117 A1* | 1/2007 | Yi | H01L 21/67034 | 34/410 |
| 2007/0169795 A1* | 7/2007 | Yi | B08B 3/041 | 134/2 |
| 2007/0221254 A1* | 9/2007 | Izumi | H01L 21/02041 | 134/94.1 |
| 2007/0277930 A1* | 12/2007 | Yokoyama | H01L 21/67051 | 156/345.31 |
| 2008/0078425 A1* | 4/2008 | Hashimoto | H01L 21/02052 | 134/105 |
| 2008/0295860 A1* | 12/2008 | Burger | H01L 21/67057 | 134/1 |
| 2009/0032062 A1* | 2/2009 | Randhawa | H01L 21/67028 | 134/18 |
| 2009/0077825 A1* | 3/2009 | Toofan | H01L 21/67313 | 34/409 |
| 2009/0084413 A1* | 4/2009 | Lewis | H01L 21/68707 | 134/201 |
| 2010/0078867 A1* | 4/2010 | Nakashima | H01L 21/67313 | 269/303 |
| 2010/0288313 A1* | 11/2010 | Amiya | H01L 21/67051 | 134/32 |
| 2011/0079240 A1* | 4/2011 | Kamikawa | B08B 3/048 | 134/1 |
| 2011/0197939 A1* | 8/2011 | Aoki | B05B 1/202 | 134/198 |
| 2012/0240958 A1* | 9/2012 | Higuchi | H01L 21/67051 | 134/10 |
| 2015/0332940 A1* | 11/2015 | Wang | H01L 21/67781 | 134/25.1 |
| 2016/0329219 A1* | 11/2016 | Lee | B08B 3/10 | |
| 2018/0068877 A1* | 3/2018 | Ishibashi | H01L 21/68728 | |
| 2020/0316652 A1* | 10/2020 | Schaal | B05B 13/0405 | |
| 2021/0166933 A1* | 6/2021 | Wang | H01L 21/0206 | |
| 2021/0242041 A1* | 8/2021 | Kwon | H01L 21/67057 | |

FOREIGN PATENT DOCUMENTS

| | | | | |
|---|---|---|---|---|
| DE | 102007058260 A1 * | 5/2009 | | H01L 21/67051 |
| JP | 2921781 B2 | 7/1999 | | |
| JP | 2000-077377 A | 3/2000 | | |
| JP | 2004-327962 A | 11/2004 | | |
| JP | 2007-258512 A | 10/2007 | | |
| JP | 4946321 B2 | 6/2012 | | |
| JP | 5125038 B2 | 1/2013 | | |
| KR | 100233281 B1 * | 12/1999 | | |
| KR | 20010049878 A * | 6/2001 | | |
| TW | I293578 B | 2/2008 | | |

* cited by examiner

SUBSTRATE CLEANING DEVICE AND SUBSTRATE CLEANING METHOD

CROSS REFERENCE TO RELATED APPLICATIONS

This application is based upon and claims the benefit of priority from the prior Japanese Patent Application No. 2021-39054, filed on Mar. 11, 2021, the entire contents of which are incorporated herein by reference.

FIELD

Embodiments of the present invention relate to a substrate cleaning device and a substrate cleaning method.

BACKGROUND

In a batch-type wafer cleaning device, when a wafer is raised from a processing tank that stores a cleaning liquid therein, foreign matter may be transferred from the outer periphery of the wafer to a surface of the wafer via the cleaning liquid.

DETAILED DESCRIPTION

According to an embodiment, a substrate cleaning device includes a processing tank, at least one spray tube, and a scanning mechanism. The processing tank can accommodate a plurality of substrates arranged in a thickness direction of the substrates. The spray tube extends in the thickness direction and is configured to emit a cleaning liquid to each substrate accommodated in the processing tank. The scanning mechanism is configured to move the spray tube along an outer periphery of the substrate to perform a scan.

Embodiments of the present invention will be explained below with reference to the drawings. In FIGS. 1 to 6, same or identical constituent elements are denoted by like reference characters and redundant explanations thereof are omitted.

First Embodiment

Figure 1:
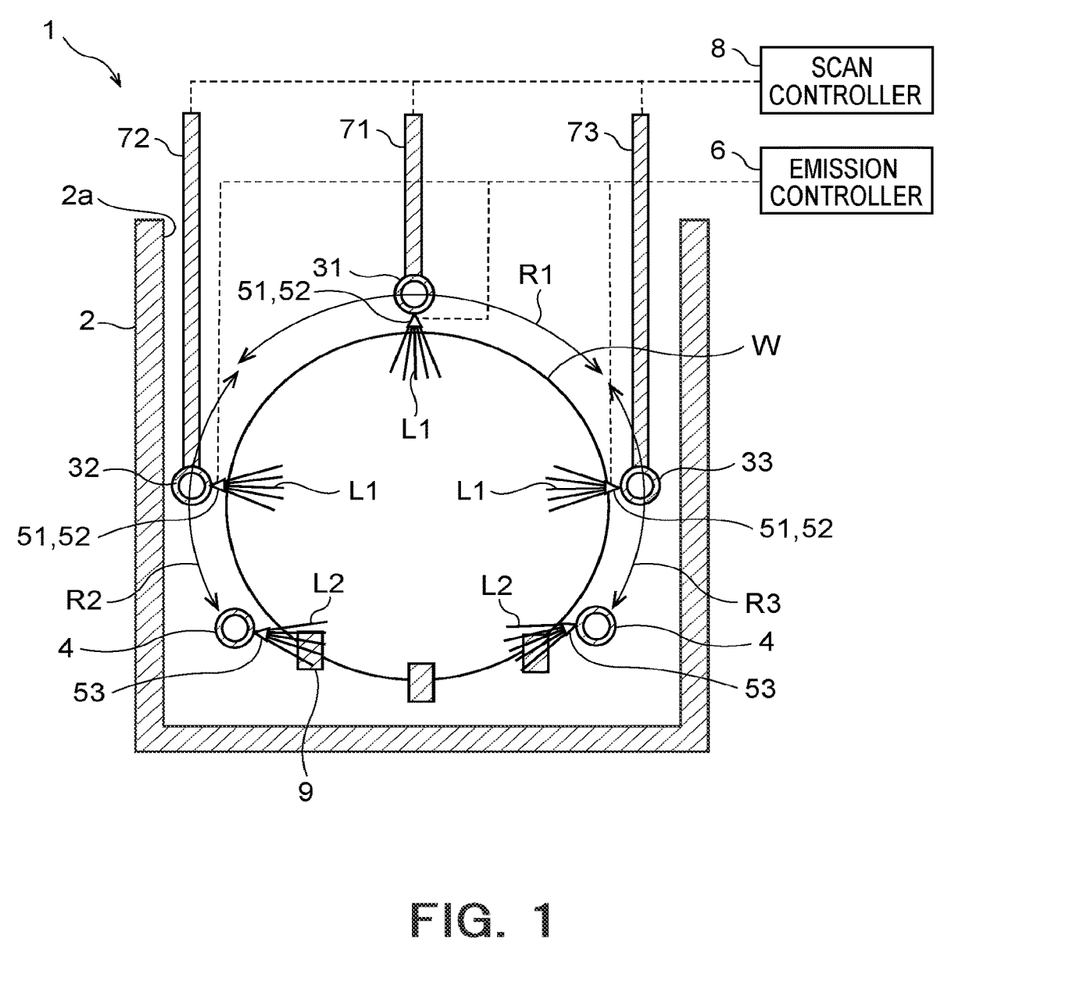
FIG. 1 is a cross-sectional view of a substrate cleaning device according to a first embodiment when cut along the in-plane direction of a wafer.
Figure 2:
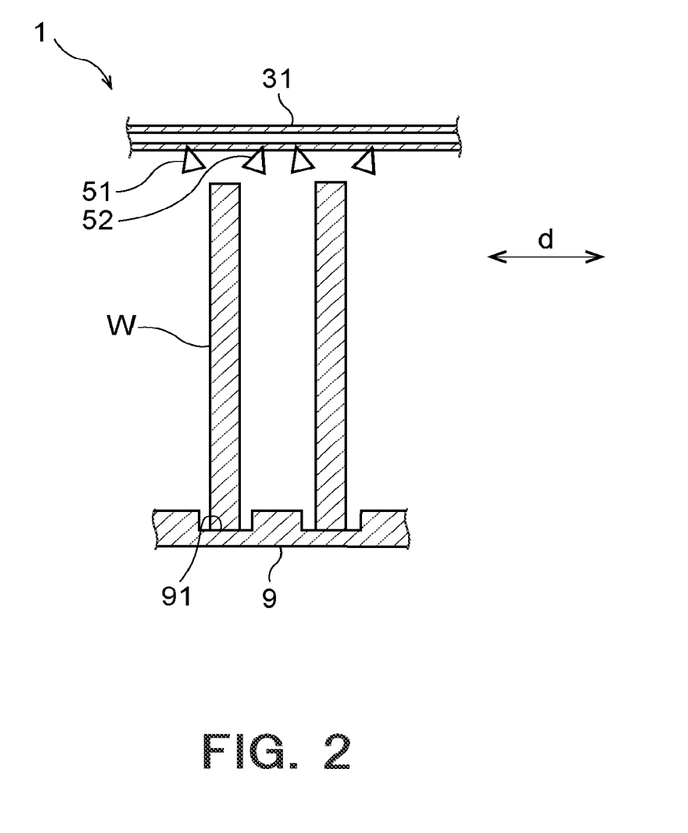
FIG. 2 is a cross-sectional view of the substrate cleaning device according to the first embodiment when cut along the thickness direction of the wafer.

FIG. 1 is a cross-sectional view of a substrate cleaning device 1 according to a first embodiment when cut along the in-plane direction of a wafer W. FIG. 2 is a cross-sectional view of the substrate cleaning device 1 according to the first embodiment when cut along the thickness direction of the wafer W. As illustrated in FIG. 1, the substrate cleaning device 1 according to the first embodiment includes a processing tank 2, an upper movable spray tube 31, a left-side movable spray tube 32, a right-side movable spray tube 33, a fixed spray tube 4, and an emission controller 6. The substrate cleaning device 1 further includes a first arm 71, a second arm 72, a third arm 73, a scan controller 8, and a jig 9.

The processing tank 2 can accommodate a plurality of the wafers W that are arranged in a thickness direction d (see FIG. 2) of the wafer W. In the example illustrated in FIG. 1, the processing tank 2 is provided with an opening 2a at its upper end, through which the wafer W can be carried into the processing tank 2 from above or carried out of the processing tank 2 upwards. More specifically, the wafer W is held upright by the jig 9 in the processing tank 2. As illustrated in FIG. 2, the jig 9 is provided with a plurality of slot grooves 91 arranged at an interval in the thickness direction d, each of which can hold the wafer W upright. The groove direction of the slot groove 91 is perpendicular to the thickness direction d.

The upper movable spray tube 31 extends in the thickness direction d and can be moved in a first scan range R1 that has an arc shape along the upper outer periphery of the wafer W. The upper movable spray tube 31 includes a first nozzle 51 that emits a cleaning liquid L1 to one surface of the wafer W and a second nozzle 52 that emits the cleaning liquid L1 to the other surface of the wafer W. The directions of emitting the cleaning liquid L1 by the nozzles 51 and 52 may be inclined with respect to the in-plane direction of the wafer W. The upper movable spray tube 31 communicates with a supply source (not illustrated) of the cleaning liquid L1. The upper movable spray tube 31 emits the cleaning liquid L1 supplied from the supply source to the wafer W accommodated in the processing tank 2 from above through the first nozzle 51 and the second nozzle 52. As the cleaning liquid L1, a chemical containing, for example, ammonia and hydrogen peroxide solution or pure water may be emitted, or the chemical and the pure water may be emitted in turn. The cleaning liquid L1 emitted to the wafer W is discharged to outside of the processing tank 2 through an outlet (not illustrated) provided in the bottom of the processing tank 2.

The left-side movable spray tube 32 extends in the thickness direction d and can be moved in a second scan range R2 that has an arc shape along the left-side outer periphery of the wafer W. The left-side movable spray tube 32 includes the first nozzle 51 and the second nozzle 52 and communicates with the supply source of the cleaning liquid L1, similarly to the upper movable spray tube 31. The left-side movable spray tube 32 emits the cleaning liquid L1 supplied from the supply source to the wafer W accommodated in the processing tank 2 from the left through the first nozzle 51 and the second nozzle 52.

The right-side movable spray tube 33 extends in the thickness direction d and can be moved in a third scan range R3 that has an arc shape along the right-side outer periphery of the wafer W. The right-side movable spray tube 33 includes the first nozzle 51 and the second nozzle 52 and communicates with the supply source of the cleaning liquid L1, similarly to the upper movable spray tube 31. The right-side movable spray tube 33 emits the cleaning liquid L1 supplied from the supply source to the wafer W accommodated in the processing tank 2 from the right through the first nozzle 51 and the second nozzle 52.

The first arm 71 moves the upper movable spray tube 31 within the first scan range R1 while holding the upper movable spray tube 31 in such a manner that the first scan range R1 is scanned. The first arm 71 can be configured by, for example, a robot arm connected at its lower end to the upper movable spray tube 31. A plurality of the first arms 71 may be provided at an interval in the thickness direction d. The upper movable spray tube 31 emits the cleaning liquid L1 to the wafer W while being moved by the first arm 71 within the first scan range R1.

The second arm 72 moves the left-side movable spray tube 32 within the second scan range R2 while holding the left-side movable spray tube 32 in such a manner that the second scan range R2 is scanned. The second arm 72 can be configured by, for example, a robot arm connected at its lower end to the left-side movable spray tube 32. A plurality of the second arms 72 may be provided at an interval in the thickness direction d. The left-side movable spray tube 32 emits the cleaning liquid L1 to the wafer W while being moved by the second arm 72 within the second scan range R2.

The third arm 73 moves the right-side movable spray tube 33 within the third scan range R3 while holding the right-side movable spray tube 33 in such a manner that the third scan range R3 is scanned. The third arm 73 can be configured by, for example, a robot arm connected at its lower end to the right-side movable spray tube 33. A plurality of the third arms 73 may be provided at an interval in the thickness direction d. The right-side movable spray tube 33 emits the cleaning liquid L1 to the wafer W while being moved by the third arm 73 within the third scan range R3.

The fixed spray tube 4 is fixed in the processing tank 2 and emits a cleaning liquid L2 to the jig 9 through a nozzle 53. In a case where the jig 9 is made of quartz, the cleaning liquid L2 emitted from the fixed spray tube 4 may be dilute hydrofluoric acid.

The emission controller 6 controls emission of the cleaning liquids L1 and L2 by the nozzles 51, 52, and 53. The emission controller 6 may be configured by, for example, a plurality of solenoid valves respectively provided in the nozzles 51, 52, and 53 and controllers that each control energization of a corresponding solenoid valve to open and close it.

The scan controller 8 controls scans with the movable spray tubes 31 to 33 by the arms 71 to 73. The scan controller 8 may be configured by, for example, a driving source such as a motor, a transmission mechanism such as a gear, that transmits a driving force of the driving source to the arms 71 to 73, and a controller that controls energization of the driving source.

Figure 3:
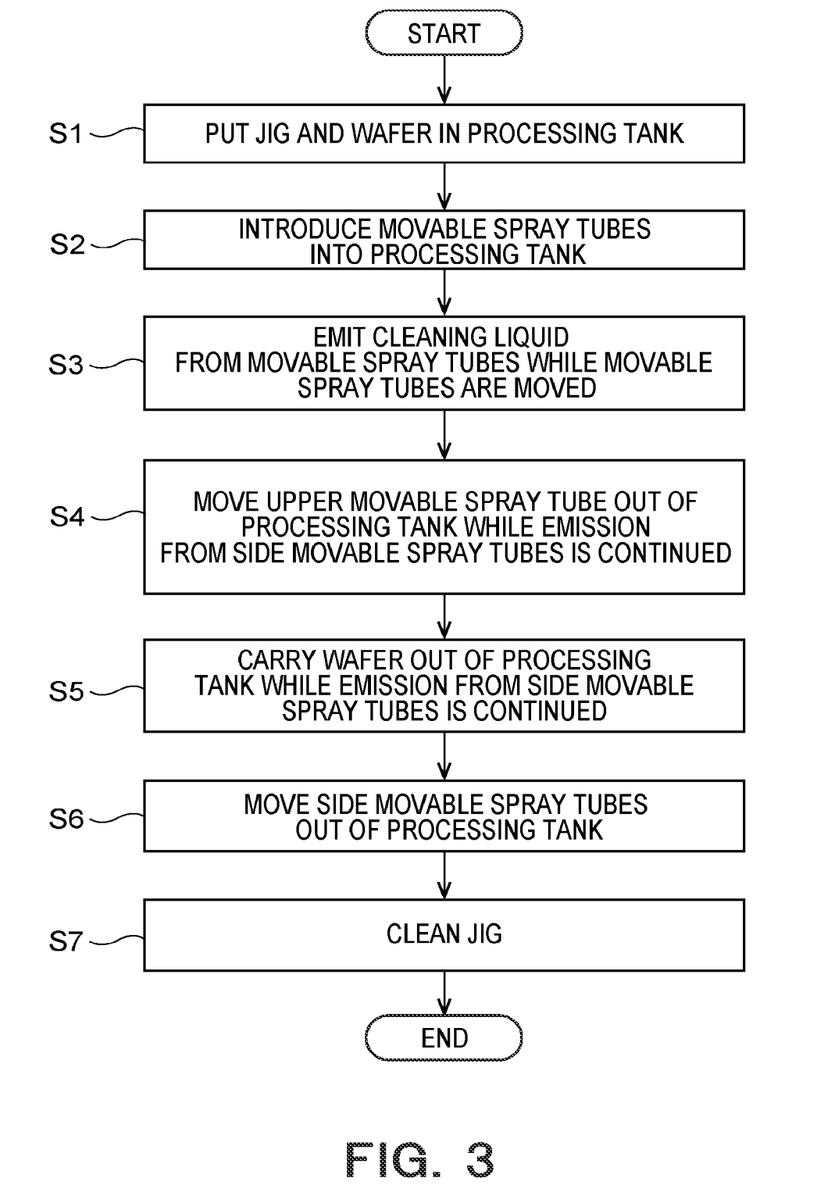
FIG. 3 is a flowchart of a substrate cleaning method according to the first embodiment.
Figure 4:
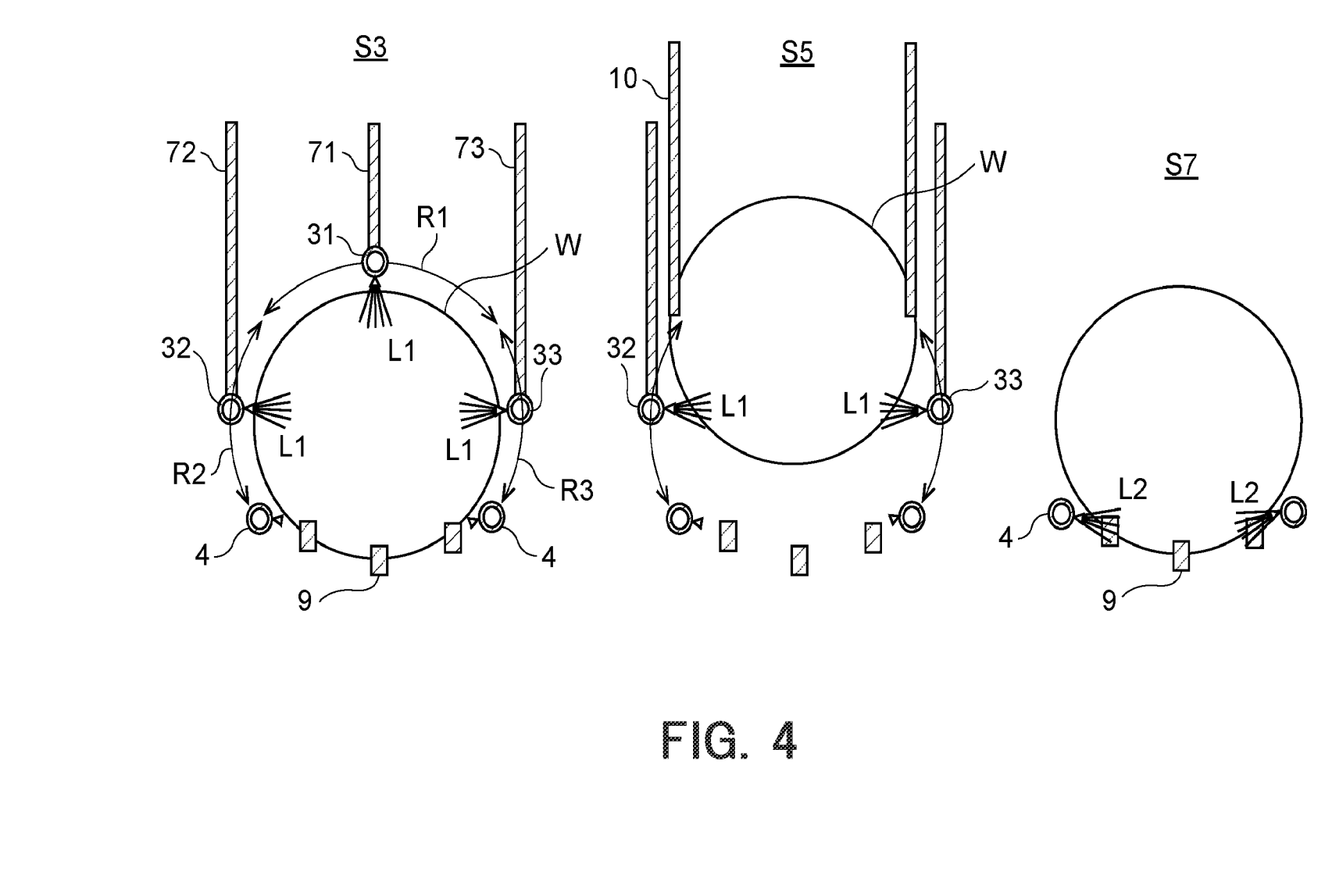
FIG. 4 is a diagram illustrating the substrate cleaning method according to the first embodiment.

Next, a substrate cleaning method according to the first embodiment is described in which the substrate cleaning device 1 described above is applied. FIG. 3 is a flowchart of the substrate cleaning method according to the first embodiment. FIG. 4 is a diagram illustrating the substrate cleaning method according to the first embodiment.

First, as illustrated in FIG. 3, the jig 9 and the wafer W are put in the processing tank 2 (Step S1). The jig 9 and the wafer W may be put by, for example, lifting the jig 9 by means of a lifter (not illustrated) provided in the processing tank 2, placing the wafer W on the lifted jig 9 by means of a robot arm, and lowering the jig 9 with the wafer W placed thereon by means of the lifter.

The movable spray tubes 31 to 33 are then introduced into the processing tank 2 by the arms 71 to 73, and are positioned at initial positions in the scan ranges R1 to R3, respectively (Step S2).

Subsequently, while the movable spray tubes 31 to 33 are moved by the arms 71 to 73, the cleaning liquid L1 is emitted to the wafer W from the movable spray tubes 31 to 33 through the nozzles 51 and 52 (Step S3). At this time, the upper movable spray tube 31 may be moved from an upper end to a lower left end of the first scan range R1 and thereafter the left-side movable spray tube 32 may be moved from an upper end to a lower end of the second scan range R2. Further, around the same time as this series of scans, the right-side movable spray tube 33 may be moved from an upper end to a lower end of the third scan range R3, after the upper movable spray tube 31 is moved from the upper end to a lower right end of the first scan range R1. By performing these scans, it is possible to efficiently remove foreign matter from a surface of the wafer W downwards. In cleaning of the wafer W, the jig 9 is not cleaned as illustrated in FIG. 4.

Subsequently, while emission of the cleaning liquid L1 by the left-side movable spray tube 32 and the right-side movable spray tube 33 is continued, the upper movable spray tube 31 is moved out of the processing tank 2 by the first arm 71 (Step S4).

The wafer W is then carried out of the processing tank 2 while emission of the cleaning liquid L1 by the left-side movable spray tube 32 and the right-side movable spray tube 33 is continued (Step S5). As illustrated in FIG. 4, the wafer W is carried out by means of a robot arm 10. By continuing emission of the cleaning liquid L1 by the left-side movable spray tube 32 and the right-side movable spray tube 33 while the wafer W is carried out upwards, it is possible to efficiently remove foreign matter from the lower end of the wafer W. The robot arm 10 transfers the wafer W carried out of the processing tank 2 to a drying tank (not illustrated) for drying.

Subsequently, the left-side movable spray tube 32 is moved out of the processing tank 2 by the second arm 72, and the right-side movable spray tube 33 is moved out of the processing tank 2 by the third arm 73 (Step S6).

The cleaning liquid L2 is then emitted from the fixed spray tube 4 as illustrated in FIG. 4, so that the jig 9 is cleaned (Step S7).

As described above, according to the first embodiment, it is possible to prevent foreign matter from adhering to a surface of the wafer W by emitting the cleaning liquid L1 to the wafer W from the movable spray tubes 31 to 33 while the movable spray tubes 31 to 33 are moved along the outer periphery of the wafer W.

Further, it is possible to shorten a cleaning time of the wafer W by using the plural movable spray tubes 31 to 33. The number of movable spray tubes is not limited to three. In a case where only one movable spray tube is provided, the number of parts and the cost can be reduced.

In addition, each of the movable spray tubes 31 to 33 is provided with the first nozzle 51 that emits the cleaning liquid L1 to one surface of the wafer W and the second nozzle 52 that emits the cleaning liquid L1 to the other surface, whereby the wafer W can be cleaned appropriately.

Second Embodiment

Figure 5:
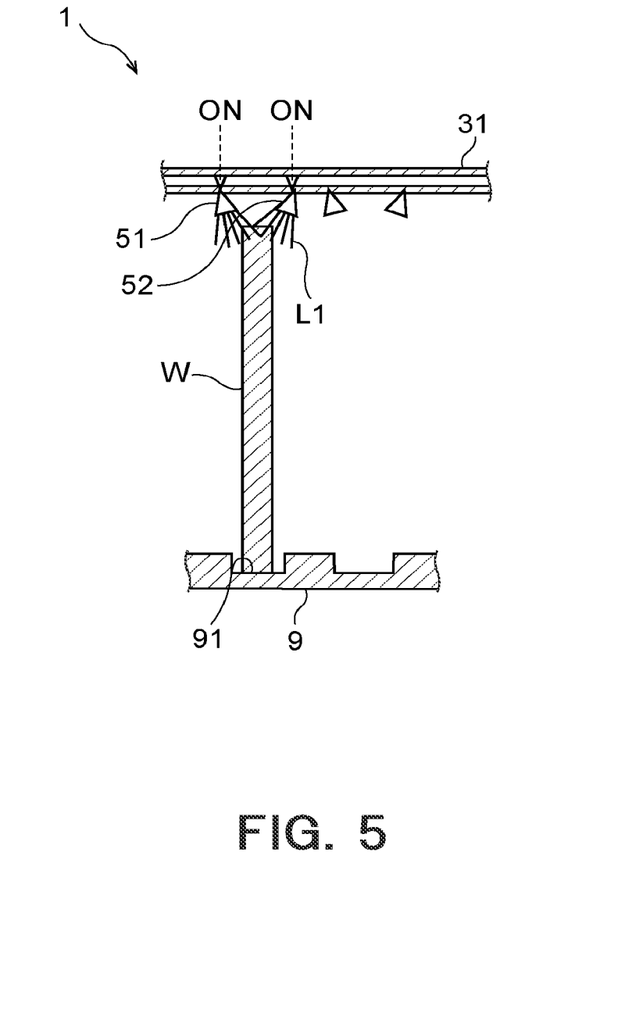
FIG. 5 is a cross-sectional view of a substrate cleaning device according to a second embodiment when cut along the thickness direction of a wafer.

Next, a second embodiment is described in which emission by the first nozzle 51 and the second nozzle 52 is controlled depending on the presence or absence of the wafer W held in the slot groove 91. FIG. 5 is a cross-sectional view of the substrate cleaning device 1 according to the second embodiment from its side.

In the second embodiment, the emission controller 6 receives a signal indicating the presence or absence of the wafer W held in each slot groove 91 from a transfer device (not illustrated) that transfers the unprocessed wafer W towards the processing tank 2. The emission controller 6 detects the presence or absence of the wafer W held in each slot groove 91 based on the received signal. The emission controller 6 controls whether the cleaning liquid L1 is emitted by the first and second nozzles 51 and 52 in accordance with the detection result. More specifically, as illustrated in FIG. 5, the emission controller 6 outputs, to the first nozzle 51 and the second nozzle 52 that correspond to the slot groove 91 in which the wafer W is held, an ON signal instructing these nozzles to emit the cleaning liquid L1, thereby causing emission of the cleaning liquid L1. The ON signal may be, for example, a signal for opening a solenoid valve. Meanwhile, the emission controller 6 does not output the ON signal to the first nozzle 51 and the second nozzle 52 that correspond to the slot groove 91 in which no wafer W is held, thereby not causing emission of the cleaning liquid L1.

According to the second embodiment, it is possible to prevent unnecessary driving of the nozzles 51 and 52, and therefore the power consumption and the chemical usage can be reduced.

Third Embodiment

Figure 6:
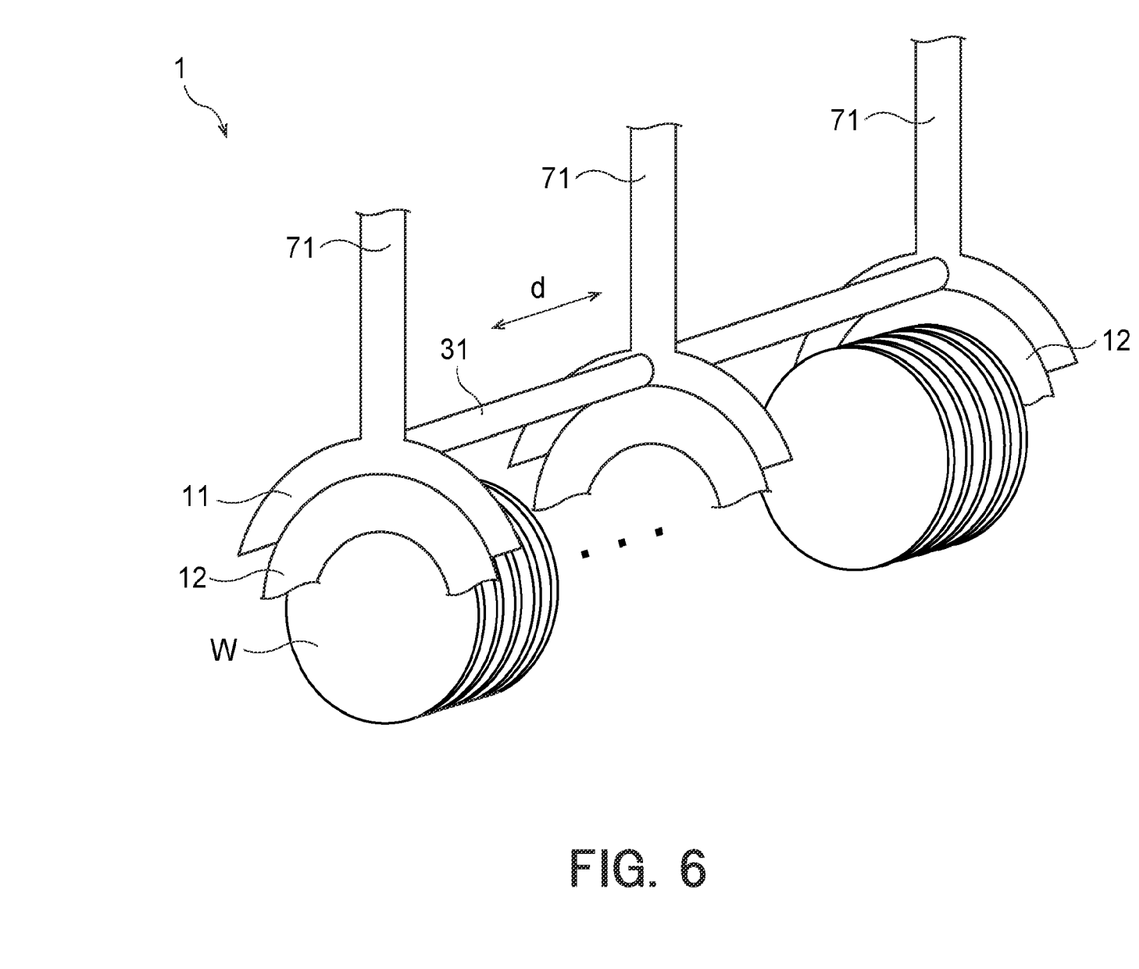
FIG. 6 is a perspective view of a substrate cleaning device according to a third embodiment.

Next, a third embodiment is described in which guides 11 that guide movement of the movable spray tubes 31 to 33 are provided. FIG. 6 is a perspective view of the substrate cleaning device 1 according to the third embodiment. In the third embodiment, the arc-shaped guide 11 is provided at the lower end of the first arm 71 as illustrated in FIG. 6, which guides movement of the upper movable spray tube 31. The guide 11 may guide movement of the upper movable spray tube 31 by the first arm 71 by sliding along a structure 12 that is provided on the processing tank 2 side and has a shape profiling the shape of the guide 11 while being in contact with the structure 2. The guides 11 are provided also for the second arm 72 and the third arm 73, similarly to the guide 11 for the first arm 71. In order to prevent interference between those guides 11 in the circumferential direction of the wafer W, the positions of the guides 11 for the respective arms 71 to 73 are shifted from one another in the thickness direction of the wafer W. The guides 11 may be guide grooves guiding movement of the movable spray tubes 31 to 33 by the arms 71 to 73, respectively.

According to the third embodiment, it is possible to clean the wafer W more appropriately by guiding movement of the movable spray tubes 31 to 33 with the guides 11.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A substrate cleaning device comprising:
a processing tank capable of accommodating a plurality of substrates arranged in a thickness direction of the substrates;
at least one spray tube extending in the thickness direction and configured to emit a cleaning liquid to each of the substrates accommodated in the processing tank; and
a scanning mechanism configured to move the at least one spray tube along an outer periphery of the substrate to perform a scan,
wherein the at least one spray tube is a plurality of spray tubes, and the scanning mechanism moves the plurality of spray tubes within a plurality of scan ranges, respectively, along the outer periphery of the substrate,
wherein each of the plurality of spray tubes includes a first nozzle configured to emit the cleaning liquid to a first surface of the substrate and a second nozzle configured to emit the cleaning liquid to a second surface of the substrate opposite to the first surface,
wherein the substrate cleaning device further comprises:
a holder arranged in the processing tank and provided with a plurality of grooves at an interval in the thickness direction, the grooves being capable of holding the substrates upright, respectively; and
a controller configured to detect whether any of the substrates is held in each of the grooves and to control whether to emit the cleaning liquid by the first nozzle and the second nozzle in accordance with a detection result,
wherein the scanning mechanism includes an arm configured to move the plurality of spray tubes along the outer periphery of the substrate while holding the plurality of spray tubes,
wherein the scanning mechanism further includes a guide configured to guide movement of the plurality of spray tubes,
wherein the plurality of spray tubes comprises:
an upper movable spray tube movable in a first scan range that has an arc shape along an upper outer periphery of the substrate,
a left-side movable spray tube movable in a second scan range that has an arc shape along a left-side outer periphery of the substrate,
a right-side movable spray tube movable in a third scan range that has an arc shape along a right-side outer periphery of the substrate, and
a fixed spray tube fixed in the processing tank,
wherein the arm comprises:
a first arm connected at its lower end to the upper movable spray tube to move the upper movable spray tube within the first scan range while holding the upper movable spray tube in such a manner that the first scan range is scanned,
a second arm connected at its lower end to the left-side movable spray tube to move the left-side movable spray tube within the second scan range while holding the left-side moveable spray tube in such a manner that the second scan range is scanned, and
a third arm connected at its lower end to the right-side movable spray tube to move the right-side movable spray tube within the third scan range while holding the right-side movable spray tube in such a manner that the third scan range is scanned,
wherein the guide comprises:
a first guide provided at a lower end of the first arm to guide movement of the upper movable spray tube,
a second guide provided a lower end of the second arm to guide movement of the left-side movable spray tube, and
a third guide provide at a lower end of the third arm to guide movement of the right-side movable spray tube.

2. The device of claim 1, further comprising:
an emission tube configured to emit a second cleaning liquid to the holder.

3. A substrate cleaning method utilizing the device of claim 1, the method comprising:

accommodating the plurality of substrates arranged in the thickness direction of the substrates in the processing tank; and emitting the cleaning liquid to each of the substrates from the at least one spray tube extending in the thickness direction while moving the spray tube by the scanning mechanism along the outer periphery of the substrate to perform a scan.

4. The method of claim 3, wherein the substrates are accommodated upright by means of the holder provided with the plurality of grooves at an interval in the thickness direction, the grooves being capable of holding the substrates upright, respectively, the scan along the outer periphery is performed with the upper moveable spray tube configured to be moved within the first scan range at an upper portion of the substrate and the left-side moveable spray tube configured to be moved within the second scan range on a side of the substrate, and wherein the method further comprises:

moving the upper moveable spray tube out of the processing tank upwards; and after the upper moveable spray tube is moved out, carrying the substrate out of the processing tank upwards while the left-side moveable spray tube is caused to continue to emit the cleaning liquid.

5. The method of claim 4, further comprising:

moving the left-side moveable spray tube out of the processing tank upwards after the substrate is carried out; and emitting a second cleaning liquid from an emission tube to the holder after the second left-side moveable spray tube is moved out.

6. The method of claim 4, wherein the scan along the outer periphery includes moving the left-side moveable spray tube from an upper end to a lower end of the second scan range after the upper moveable spray tube is moved from an upper end to a lower end of the first scan range.

* * * * *